United States Patent
Mabuchi et al.

(10) Patent No.: US 8,553,124 B2
(45) Date of Patent: Oct. 8, 2013

(54) SOLID-STATE IMAGE CAPTURING DEVICE, METHOD OF DRIVING SOLID-STATE IMAGE CAPTURING DEVICE, AND IMAGE CAPTURING APPARATUS

(75) Inventors: Keiji Mabuchi, Kanagawa (JP); Takeshi Yanagita, Tokyo (JP); Yorito Sakano, Kanagawa (JP)

(73) Assignee: Sony Corporation (JP)

( * ) Notice: Subject to any disclaimer, the term of this patent is extended or adjusted under 35 U.S.C. 154(b) by 437 days.

(21) Appl. No.: 12/690,537

(22) Filed: Jan. 20, 2010

(65) Prior Publication Data

US 2010/0188541 A1 Jul. 29, 2010

(30) Foreign Application Priority Data

Jan. 28, 2009 (JP) ................................. 2009-016265

(51) Int. Cl.
*H04N 3/14* (2006.01)
*H04N 5/335* (2011.01)

(52) U.S. Cl.
USPC ......................................................... 348/308

(58) Field of Classification Search
None
See application file for complete search history.

(56) References Cited

U.S. PATENT DOCUMENTS

| 7,872,286 B2 * | 1/2011 | Okita et al. | 257/291 |
| 2004/0130641 A1 * | 7/2004 | Mabuchi | 348/302 |
| 2007/0272830 A1 * | 11/2007 | Altice et al. | 250/208.1 |

FOREIGN PATENT DOCUMENTS

| EP | 1677514 | 7/2006 |
| EP | 1681856 | 7/2006 |
| JP | 2000-059695 | 2/2000 |
| JP | 2006-191236 | 7/2006 |
| JP | 2006-197382 | 7/2006 |
| JP | 2010-016417 | 1/2010 |

OTHER PUBLICATIONS

European Search Report corresponding to European Serial No. 10000189.0 dated Apr. 7, 2010.

\* cited by examiner

*Primary Examiner* — Albert Cutler
(74) *Attorney, Agent, or Firm* — Sheridan Ross P.C.

(57) ABSTRACT

A solid-state image capturing device includes: a pixel array unit including plural pixels each converting light selectively incident through a mechanical shutter into charges to be stored in a storage portion and having an overflow path through which charges exceeding a saturation charge amount are discharged; and a driving unit starting an exposure by simultaneously resetting all pixels of the pixel array unit, maintaining the overflow path in an opened state during the exposure period, and closing the overflow path during a period while signals are read from the pixels after ending the exposure by closing the mechanical shutter.

8 Claims, 11 Drawing Sheets

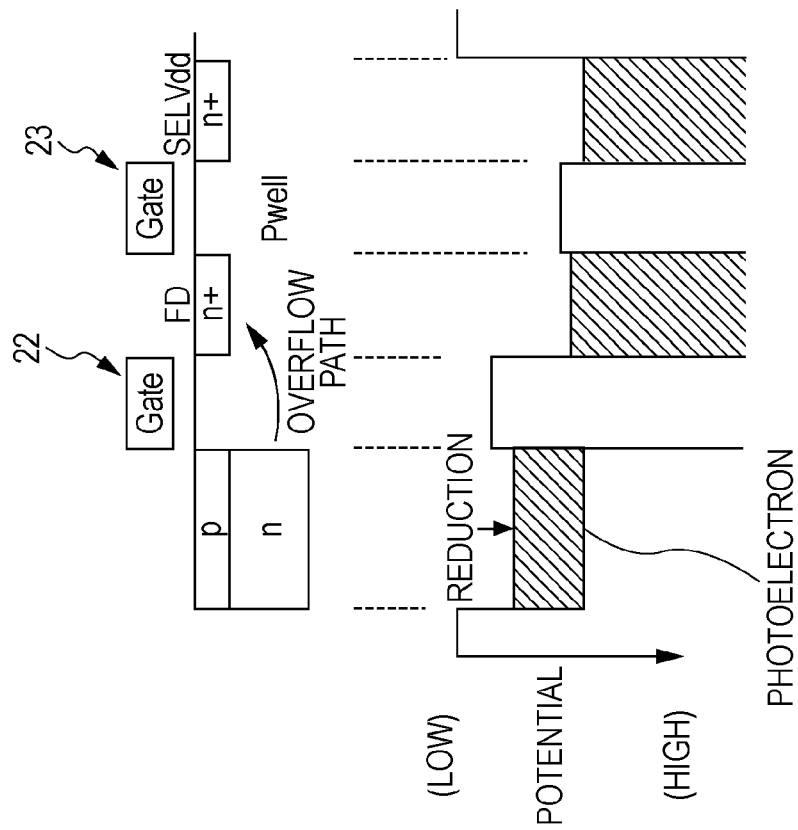
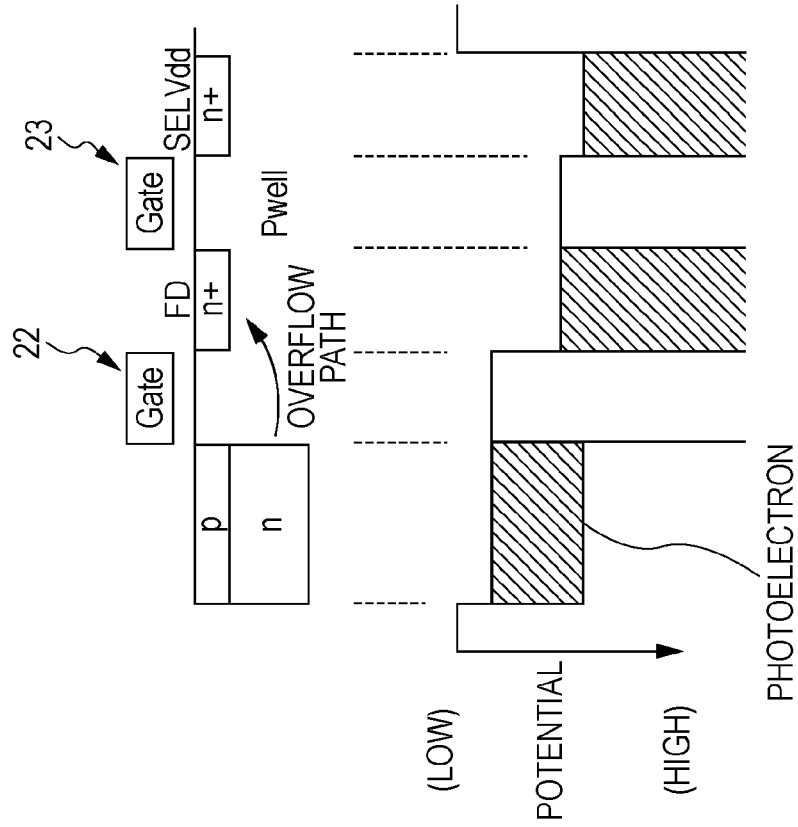

CASES OF OPERATIONS 1 AND 4

READING ROW

CASES OF OPERATIONS 1 AND 4

NON-READING ROW

CASE OF OPERATION 2

FIRST EMBODIMENT
ALL PIXEL ROW

CASE OF OPERATION 2

RELATED ART
ALL PIXEL ROW

CASE OF OPERATION 3

FIRST EMBODIMENT
ALL PIXEL ROW

CASE OF OPERATION 3

RELATED ART
ALL PIXEL ROW

CASES OF OPERATIONS 1 AND 2

CASE OF OPERATION 2

CASE OF OPERATION 3

SOLID-STATE IMAGE CAPTURING DEVICE, METHOD OF DRIVING SOLID-STATE IMAGE CAPTURING DEVICE, AND IMAGE CAPTURING APPARATUS

BACKGROUND OF THE INVENTION

1. Field of the Invention

The present invention relates to a solid-state image capturing device, a method of driving a solid-state image capturing device, and an image capturing apparatus, and particularly, to a solid-state image capturing device which is used together with a mechanical shutter, a method of driving the solid-state image capturing device, and an image capturing apparatus having the solid-state image capturing device.

2. Description of the Related Art

A solid-state image capturing device is classified into an X-Y address type solid-state image capturing device represented by a CMOS (Complementary Metal Oxide Semiconductor) image sensor and a charge-transfer type solid-state image capturing device represented by a CCD (Charge Coupled Device) image sensor. Here, in the CMOS image sensor, a random access of a pixel signal is possible. In addition, compared with a CCD image sensor, the CMOS image sensor is capable of rapidly reading the pixel signal while ensuring high sensitivity and low power consumption.

However, in many CMOS image sensors, an electronic shutter function is provided so as to electronically start a new signal charge storage operation by resetting signal charges stored in a photoelectric converter. The shutter type of the electronic shutter function of the CMOS image sensor is a so-called rolling shutter (called a focal plane shutter) type in which an exposure start and an exposure end are set for each pixel row of plural pixels arranged in two dimensions.

Accordingly, in the rolling shutter type CMOS image sensor, the exposure periods for the pixel rows are deviated (different) from each other while in a global shutter type CCD image sensor the exposure of all pixels starts at the same timing. In addition, when the exposure periods of the pixel rows are deviated from each other, a captured image is distorted.

Therefore, in the past, the CMOS image sensor was used together with a mechanical shutter for selectively shielding light incident onto a light receiving surface of the CMOS image sensor so as to have the same exposure period in all pixel rows (For example, see Japanese Unexamined Patent Application Publication No. 2006-191236).

In detail, when the mechanical shutter is opened, and the pixels of all the pixel rows are simultaneously reset, the signal charge storage operation starts. Then, the mechanical shutter is closed so as to end the exposure. After the exposure ends, pixel signals are read for every pixel row. According to a series of operations, since the exposure periods for all the pixel rows are equal to each other without any deviation, the captured image is not distorted.

SUMMARY OF THE INVENTION

However, in the related art, a problem arises in that the amount of charge collected (stored) in the pixels decreases in a sequential order of the read pixels during a period while the signals of the pixels are read after closing the mechanical shutter (the detailed reason will be described later).

Therefore, it is desirable to provide a solid-state image capturing device, a method of driving a solid-state image capturing device, and an image capturing apparatus capable of suppressing a phenomenon such that the amount of charge collected in pixels decreases by an amount corresponding to the next reading pixel after closing a mechanical shutter when exposure of all pixels is simultaneously performed by using the mechanical shutter.

According to an embodiment of the invention, there is provided a solid-state image capturing device including: a pixel array unit including plural pixels each converting light selectively incident through a mechanical shutter into charges to be stored in a storage portion and having an overflow path through which charges exceeding a saturation charge amount are discharged, wherein an exposure starts by simultaneously resetting all pixels of the pixel array unit, the overflow path is maintained in an opened state during the exposure period, and the overflow path is driven in a closing direction during a period while signals are read from the pixels after ending the exposure by closing the mechanical shutter.

In the solid-state image capturing device having the above-described configuration, the exposure period starts by simultaneously resetting all pixels, and the exposure period ends by closing the mechanical shutter. Likewise, since the exposure periods of the pixels of all the pixel rows are equal to each other by using the mechanical shutter, it is possible to prevent the captured image from being distorted. In addition, since the overflow path is maintained in an opened state during the exposure period, it is possible to suppress charges from flowing into the adjacent pixels, and thus to suppress blooming.

In addition, since the overflow path is driven in a closing direction during a period while the signals are read after the exposure ends, it is possible to reduce a phenomenon such that a part of charges collected in the storage portion is discharged as a sub-threshold current through the overflow path by thermal excitation. Accordingly, it is possible to suppress a phenomenon such that the amount of charge collected in the pixels decreases in a sequential order of the read pixels, that is, a decrease in saturation charge amount.

According to the embodiment of the invention, since the overflow path is operated during the exposure period, and is not operated after closing the mechanical shutter, it is possible to suppress the blooming and to suppress the decrease in saturation charge amount which is a problem of the mechanical shutter operation.

BRIEF DESCRIPTION OF THE DRAWINGS

FIGS. 4A and 4B are diagrams schematically showing a part of a section of a unit pixel and a potential of the part, which are provided for the description of the technology of the invention.

DESCRIPTION OF THE PREFERRED EMBODIMENTS

Hereinafter, embodiments of the invention will be described in detail with reference to the drawings. In addition, the description is made in the following order.
1. Solid-state image capturing device (example of CMOS image sensor) according to embodiment of the invention
2. Image capturing apparatus (example of digital still camera) according to embodiment of the invention
3. Technology of embodiment of the invention and problem thereof
4. Characteristic points of embodiment of the invention
   4-1. First Embodiment (example of first driving timing)
   4-2. Second Embodiment (example of second driving timing)
5. Modified Example
6. Application (example of plural pixel sharing structure)
1. Solid-state Image Capturing Device According to Embodiment of the Invention FIG. 1 is a system configuration diagram showing a schematic configuration of a solid-state image capturing device according to an embodiment of the invention, for example, a CMOS image sensor which is a kind of X-Y address type solid-state image capturing device.

Figure 1:
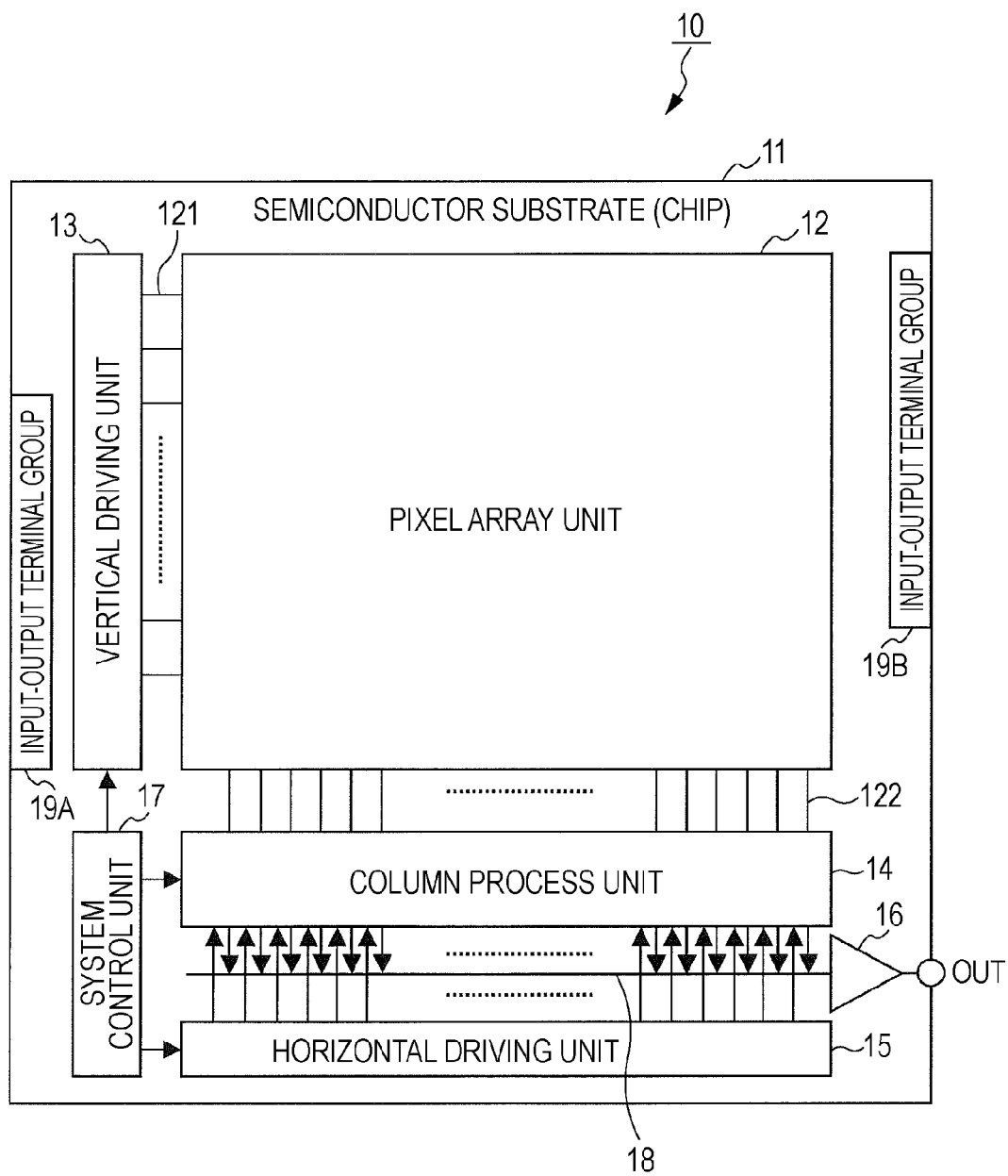
FIG. 1 is a system configuration diagram showing a schematic configuration of a CMOS image sensor according to an embodiment of the invention.

As shown in FIG. 1, a CMOS image sensor 10 according to this application includes a pixel array unit 12 which is formed on a semiconductor substrate (chip) 11, and a peripheral circuit unit which is integrated on the same chip 11 as that of the pixel array unit 12. As the peripheral circuit unit, for example, a vertical driving unit 13, a column process unit 14, a horizontal driving unit 15, an output circuit unit 16, and a system control unit 17 are provided.

The pixel array unit 12 is provided with unit pixels (hereinafter, simply referred to as "pixels" in some cases) which are not shown in the drawings and are arranged in a matrix shape in two dimensions, where each of the unit pixel includes a photoelectric converter (photoelectric conversion element) performing a photoelectric conversion on incident visible light and storing signal charges (photocharges). The detailed configuration of the unit pixel will be described later.

The pixel array unit 12 is further provided with a pixel driving line 121 wired for each row of the matrix-shaped pixel array in the left/right direction (the pixel arrangement direction/the horizontal direction of the pixel row) in the drawing, and a vertical signal line 122 wired for each column thereof in the up/down direction (the pixel arrangement direction/the vertical direction of the pixel column) of the drawing. In FIG. 1, an example is described in which one pixel driving line 121 is provided for each row, but the invention is not limited thereto. One end of the pixel driving line 121 is connected to an output terminal of the vertical driving unit 13 corresponding to each row.

The vertical driving unit 13 is a pixel driving unit which includes a shift register, an address decoder, or the like, and drives the pixels of the pixel array unit 12 at the same time or for every pixel row. Although the detailed configuration of the vertical driving unit 13 is not shown in the drawing, generally, the vertical driving unit 13 includes two scanning systems, that is, a reading scanning system and a sweep-out scanning system.

The reading scanning system sequentially and selectively scans the unit pixels of the pixel array 12 for every pixel row in order to read the signal from the unit pixels. The sweep-out scanning system performs a sweep-out scanning operation earlier by the time corresponding to a shutter speed than the reading scanning operation.

Due to the sweep-out scanning operation of the sweep-out scanning system, unnecessary charges are swept away (reset) from the photoelectric converter of the sweep-out scanned unit pixels. In addition, due to the sweep-out (reset) operation of the unnecessary charges performed by the sweep-out scanning system, a so-called electronic shutter operation is performed. Here, the electronic shutter operation indicates an operation in which photocharges of the photoelectric converters are removed and a new exposure starts (a signal charge storage starts).

The reading signal generated by the reading operation of the reading scanning system corresponds to the intensity of incident light during the precedent reading operation or after the electronic shutter operation. In addition, a period from the sweep-out timing of the electronic shutter operation or the reading timing of the precedent reading operation to the reading timing of the current reading operation is a photocharge storage period (exposure period) of the unit pixel.

The signal output from each unit pixel of the pixel row selectively scanned by the vertical driving unit 13 is supplied to the column process unit 14 through the vertical signal line 122. The column process unit 14 performs a predetermined signal process on the signal output from each unit pixel of the selected row through the vertical signal line 122 for every pixel row of the pixel array unit 12, and temporarily stores the pixel signal after the signal process.

In detail, the column process unit 14 receives the signal of each unit pixel and performs, for example, a signal process such as a noise removing process through a CDS (Correlated Double Sampling), a signal amplification process, or an AD (Analog-Digital) conversion process. In the noise removal process, original pixel fixed pattern noise such as reset noise or a difference in threshold value of an amplifier transistor is removed. In addition, since the signal process described herein is merely an example, the signal process is not limited thereto.

The horizontal driving unit 15 includes a shift register, an address decoder, or the like, and sequentially selects a unit circuit of the column process unit 14 corresponding to the pixel row. Due to the selective scanning operation of the horizontal driving unit 15, the pixel signal subjected to the signal process for each unit circuit in the column process unit 14 is sequentially output to a horizontal bus 18, and is transmitted to the output circuit unit 16 through the horizontal bus 18.

The output circuit unit 16 performs a signal process on the signal transmitted through the horizontal bus 18, and outputs the result. As the signal process of the output circuit unit 16, various digital signal processes may be exemplified, such as a process only using a buffering, a black level adjustment before the buffering, or a difference correction for each row.

The system control unit 17 receives a clock applied from the outside of the chip 11 or data commanding an operation mode, and outputs data of internal information of the CMOS image sensor 10. The system control unit 17 includes a timing generator for generating various timing signals, and controls the driving operation of the peripheral circuit units such as the vertical driving unit 13, the column process unit 14, and the horizontal driving unit 15 on the basis of the various timing signals.

The peripheral edge portion of the chip 11 is provided with terminals of input-output terminal groups 19A and 19B including a power source terminal. The input-output terminal groups 19A and 19B perform a voltage supply operation and a signal exchange operation between the inside and outside of the chip 11. The arrangement positions of the input-output terminal groups 19A and 19B are set to convenient positions in consideration of a signal input direction or a signal output direction.

Circuit Configuration of Unit Pixel

Figure 2:
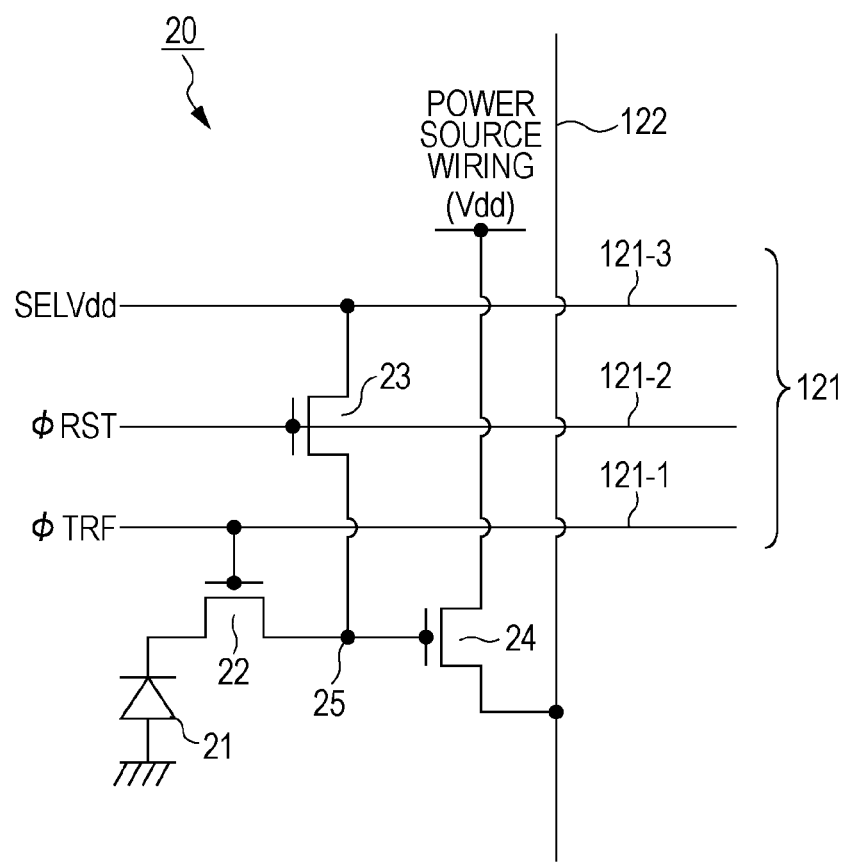
FIG. 2 is a circuit diagram showing an example of a circuit configuration of a unit pixel.

FIG. 2 is a circuit diagram showing an example of a circuit configuration of a unit pixel 20. As shown in FIG. 2, the unit pixel 20 according to the circuit example includes, for example, three transistors, that is, a transmission transistor 22, a reset register 23, and an amplifier transistor 24 in addition to a photoelectric converter, for example, a photodiode 21.

Here, as three transistors 22 to 24, for example, an N-channel MOS transistor is used. However, since the conduction combination of the transmission transistor 22, the reset transistor 23, and the amplifier transistor 24 is merely an example, the invention is not limited to the combination.

Regarding the unit pixel 20, as the pixel driving line 121, for example, three driving wirings, that is, a transmission wiring 121-1, a reset wiring 121-2, and a selection wiring 121-3 are commonly provided in each pixel of the same pixel row.

The transmission wiring 121-1 and the reset wiring 121-2 are applied with a High active transmission pulse φTRF (high level is active) and a reset pulse φRST from the vertical driving unit 13. In addition, the selection wiring 121-3 is applied with a selection power source SELVdd capable of selecting two power source potentials, that is, a power source Vdd level and a Low level of about 0.8 V.

In the photodiode 21, an anode electrode is connected to a negative power source (for example, a ground), and received light is subjected to a photoelectric conversion so as to obtain photocharges (here, photoelectrons) having a charge amount in accordance with the intensity of the light. A cathode electrode of the photo diode 21 is electrically connected to the gate electrode of the amplifier transistor 24 through the transmission transistor 22.

Hereinafter, a node 25 electrically connected to the gate electrode of the amplifier transistor 24 is referred to as a FD (Floating Diffusion) portion. That is, the FD portion 25 is a node which includes a diffusion layer corresponding to the drain region of the transmission transistor 22, the gate electrode of the amplifier transistor 24, and a wiring connecting them to each other, and has parasitic capacity.

The transmission transistor 22 is connected between the cathode electrode of the photodiode 21 and the FD portion 25. The transmission transistor 22 becomes an ON state when the gate electrode thereof is applied with the transmission pulse φTRF through the transmission wire 121-1, and transmits the photocharges subjected to the photoelectric conversion in the photodiode 21 to the FD portion 25.

In the reset transistor 23, the FD portion 25 is set to one main electrode, and the other main electrode is selected to the selection wiring 121-3. In the case of this example, one main electrode is set to the source electrode, and the other main electrode is set to the drain electrode. The reset transistor 23 becomes an ON state when the reset pulse φRST is applied to the gate electrode thereof through the reset wiring 121-2, and resets the FD portion 25 by discharging the charges of the FD portion 25 to the selection wiring 121-3. The FD portion 25 is reset by the reset operation of the unit pixel 20.

In the amplifier transistor 24, the gate electrode is connected to the FD portion 25, the drain electrode is connected to the pixel power source Vdd, and the source electrode is connected to the vertical signal line 122. In addition, the amplifier transistor 24 outputs the potential of the FD portion 25 after the reset operation of the reset transistor 23 to the vertical signal line 122 as the reset signal (reset level). The amplifier transistor 24 further outputs the potential of the FD portion 25 after the photocharges are transmitted by the transmission transistor 22 to the vertical signal line 122 as the light storage signal.

In the pixel circuit having the above-described configuration, the vertical signal line 122 is connected to plural pixels 20, but the FD portion 25 is set to a low voltage in the (non-selection) pixel where the signal reading operation is not desired to be performed. In addition, only the FD portion 25 of the (selection) pixel where the signal reading operation is desired to be performed is set to a voltage sufficiently higher than that of the non-selection pixel. Accordingly, it is possible to output only the signal of the pixel where the signal reading operation is desired to be performed to the vertical signal line 122.

In detail, due to the selection power source SELVdd and the reset transistor 23, the FD portion 25 of the non-selection pixel is set to a low voltage (for example, the Low level of about 0.8 V), and the FD portion 25 of the selection pixel is set to a high voltage (for example, a Vdd level). Accordingly, it is possible to select the pixels 20 by the unit of the row.

In the CMOS image sensor 10 of the general system configuration described above, a rolling shutter (focal plane shutter) is performed in which the exposure start or the exposure end for each pixel row is set by the electronic shutter. However, in the rolling shutter, since the exposure periods for the respective pixel rows are deviated (different) from each other, the captured image is distorted.

On the contrary, the invention adopts a technology in which the CMOS image sensor 10 having the above-described configuration is used together with a mechanical shutter for selectively shielding light incident to the imaging surface thereof, and the exposure periods for all pixels are made to be equal to each other so as to prevent the captured image from being distorted.

In the above description, the CMOS image sensor is exemplified in which the unit pixels for detecting charges in accordance with the intensity of visible light as a physical amount are arranged in a matrix shape. However, the invention may be applied to all the X-Y address type solid-state image capturing devices.

In addition, the solid-state image capturing device may be formed as one chip, or may be a module having an imaging function and a package of an imaging unit and a signal processor or an optical system.

2. Image Capturing Apparatus According to Embodiment of the Invention

Figure 3:
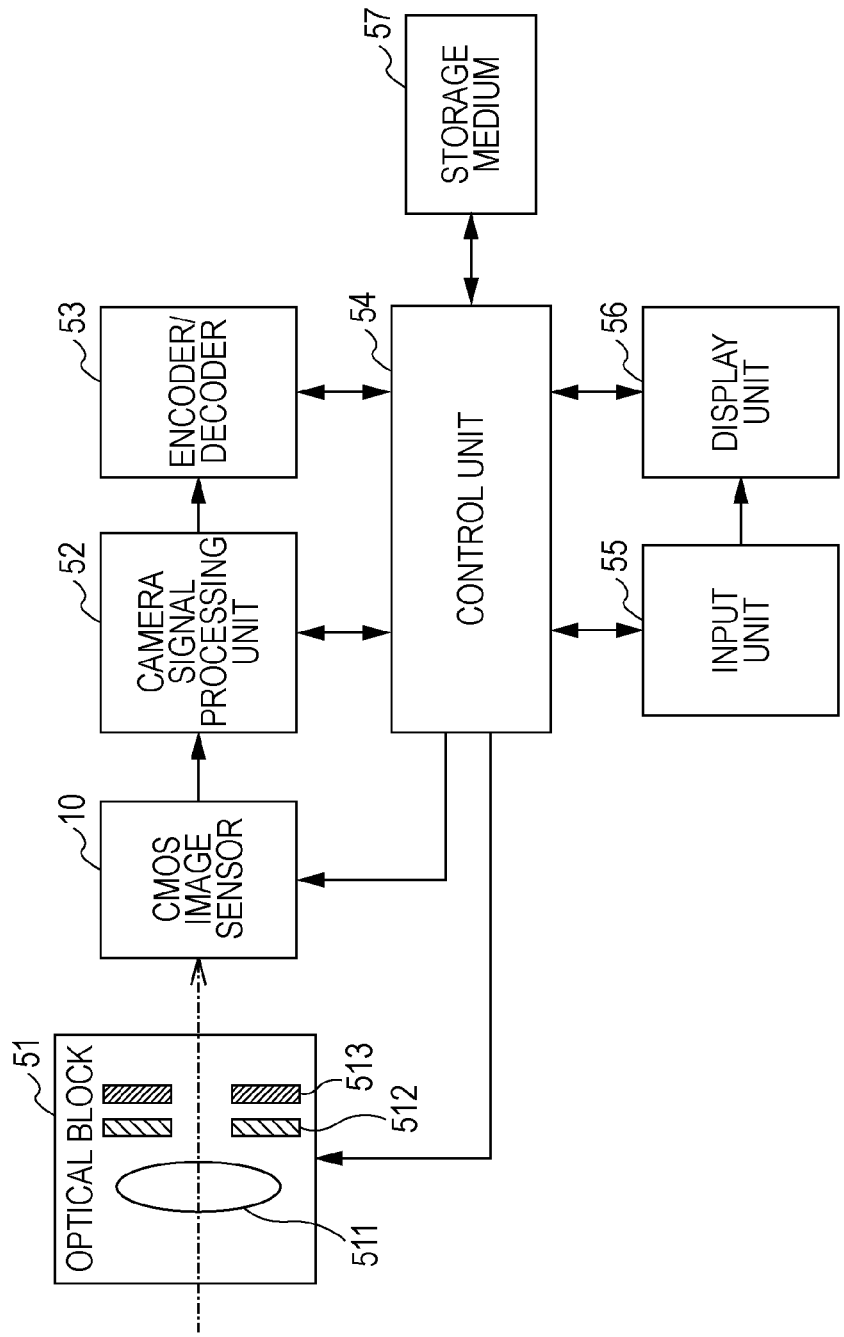
FIG. 3 is a system configuration diagram showing a schematic configuration of an image capturing apparatus according to the embodiment of the invention.

Hereinafter, an image capturing apparatus according to the embodiment of the invention will be described which uses the CMOS image sensor together with the mechanical shutter. FIG. 3 is a system configuration diagram schematically showing a configuration of the image capturing apparatus according to the embodiment of the invention.

As shown in FIG. 3, the image capturing apparatus according to the embodiment of the invention is, for example, a digital still camera, and includes an optical block 51, a camera signal processing unit 52, an encoder/decoder 53, a control unit 54, an input unit 55, a display unit 56, and a storage medium 57 in addition to the CMOS image sensor 10.

The optical block 51 includes a lens 511 which condenses light from an object to the CMOS image sensor 10, an iris 512 which adjusts the intensity of light, and a mechanical shutter 513 which selectively obtains light.

The optical block 51 further includes a lens driving mechanism which performs a focusing operation or a zooming operation by moving the lens 511, an iris mechanism which controls the iris 12, and a mechanical shutter mechanism which drives the mechanical shutter 513. These mechanisms are driven on the basis of the control signal from the control unit 54.

The CMOS image sensor 10 is an X-Y reading type solid-state image capturing device, and performs a timing control such as an exposure or signal reading operation of the pixel 20 in accordance with the control signal from the control unit 54.

Under the control of the control unit 54, the camera signal processing unit 52 performs a camera signal process such as a white balance adjusting process or a color correction process on the image signal output from the CMOS image sensor 10.

The encoder/decoder 53 is operated under the control of the control unit 54, and performs a compression coding process on the image signal output from the camera signal processing unit 52 so as to have a predetermined still image data format such as a JPEG (Joint Photographic Coding Experts Group) format.

In addition, the encoder/decoder 53 performs an expansion decoding process on the coded data of the still image supplied from the control unit 54. Further, in the encoder/decoder 53, the compression coding process/expansion decoding process of a moving image may be performed so as to have an MPEG (Moving Picture Experts Group) format.

The control unit 54 is, for example, a microcontroller including a CPU (Central Processing Unit), a ROM (Read Only Memory), a RAM (Random Access Memory), and the like. In addition, the control unit 54 generally controls the respective units of the image capturing apparatus by executing a program stored in the ROM or the like.

The input unit 55 includes, for example, various operations keys such as a shutter release button, a lever, and a dial, and outputs various control signals in accordance with a user's input operation to the control unit 54.

The display unit 56 includes a display device such as an LCD (Liquid Crystal Display) or an interface circuit thereof, and generates an image signal to be displayed on the display device on the basis of the image signal supplied from the control unit 54. In addition, the display unit 56 supplies the generated image signal to the display device so as to display the generated image on the display device.

The storage medium 59 is realized by, for example, a portable semiconductor memory, an optical disk, an HDD (Hard Disk Drive), or a magnetic tape, and stores the image data file coded by the encoder/decoder 53 by obtaining the image data file from the control unit 54. In addition, the storage medium reads the designated data based on the control signal from the control unit 54, and outputs the data to the control unit 54.

In the above description, the digital still camera is exemplified as the image capturing apparatus, but the invention is not limited to the digital still camera. That is, the invention may be applied to all image capturing apparatuses having a mechanical shutter capable of selectively obtaining incident light from the object. In addition, a module mounted to an electronic apparatus having an imaging function, that is, a camera module may be used as the image capturing apparatus.

3. Technology of Embodiment of the Invention and Problem Thereof

In the image capturing apparatus having the above-described configuration, the technology of the invention will be described first. That is, the technology of the embodiment of the invention is a technology in which the CMOS image sensor 10 is used together with the mechanical shutter 513, and the exposure periods for all pixels are made to be equal to each other so as to prevent the captured image from being distorted. FIGS. 4A and 4B schematically show a part of a section of the unit pixel 20 and a potential of the portion.

First, in the state where the mechanical shutter 513 is opened, photoelectrons (signal charges) starts to be stored by simultaneously resetting the pixels of all the pixel rows. In the case where the intensity of the light is sufficient during the exposure period, the photoelectrons are collected in the photodiode 21 until the photoelectrons overflow therefrom. The overflow position is a position where a potential is the highest (a potential is the deepest) in the periphery of the photodiode 21.

Here, when the photoelectrons overflows from the photodiode 21 to the photodiodes 21 of the adjacent pixels, a false signal called blooming is generated. Here, a path (hereinafter, referred to as "overflow path") for discharging the photoelectrons overflowing from the photodiode 21 and exceeding a predetermined saturation charge amount is provided in a direction not facing the photodiodes 21 of the adjacent pixels.

The overflow path is configured by an FET (Field Effect Transistor) in which a photoelectron storage portion of the photodiode 21 as an inlet of the path is set to the source region, and the diffusion layer of the FD portion 25 as the outlet of the path is set to the drain region. In addition, in the case of this example, the FET forming the overflow path is the transmission transistor 22 for transmitting the photoelectrons stored in the photodiode 21 to the FD portion 25.

In this example, an overflow bus is provided in the FD portion 25 from the gate of the transmission transistor 22, and the photoelectrons are made to overflow to the FD portion 25 through the overflow bus. In addition, when the exposure ends by closing the mechanical shutter 513, the inflow of the photoelectrons to the photodiode 21 stops.

The potential immediately after closing the mechanical shutter 513 is shown in FIG. 4A. That is, in the saturation state immediately after closing the mechanical shutter 513, the photoelectrons are collected up to a potential barrier below the gate of the transmission transistor 22 of the photodiode 21.

After the exposure ends, the pixel signal is read for every pixel row. At this time, as described above, during a period in which the signal for each pixel is read after closing the mechanical shutter 513, the amount of charge collected (stored) in each pixel decreases, that is, the saturation charge amount decreases in a sequential order of the read pixels. The reason is as below.

During a period while the signals of the pixels are read, a part of the photoelectrons collected in the photodiode 21 is discharged as a sub-threshold current through the overflow path by thermal excitation, that is, the number of photoelectrons inside the photodiode 21 decreases. The potential in the saturation state before reading the signal after closing the mechanical shutter 513 is shown in FIG. 4B.

The period for reading the signals of the pixels after closing the mechanical shutter 513 is short in the first row of the read pixels, but is long in the last row thereof. Accordingly, the amount of photoelectrons lost in the vicinity of the last row is large, and hence a dynamic range decreases. Depending on the type of the object, 30% to 50% of photoelectrons are lost. That is, only 50% to 70% of the saturated electrons of the photodiode 21 may be used as signals.

4. Characteristic Points of Embodiment of the Invention

Here, the invention adopts a driving method of suppressing a phenomenon such that the amount of charge collected in the pixels decreases in a sequential order of the read pixels after closing the mechanical shutter 513 upon performing the simultaneous exposure of all pixels by using the mechanical shutter 513. Hereinafter, detailed embodiments of the driving method of suppressing the phenomenon such that the amount of charge collected in the pixels decreases after closing the mechanical shutter 513, that is, a decrease in saturation charge amount will be described.

4-1. First Embodiment

Figure 5:
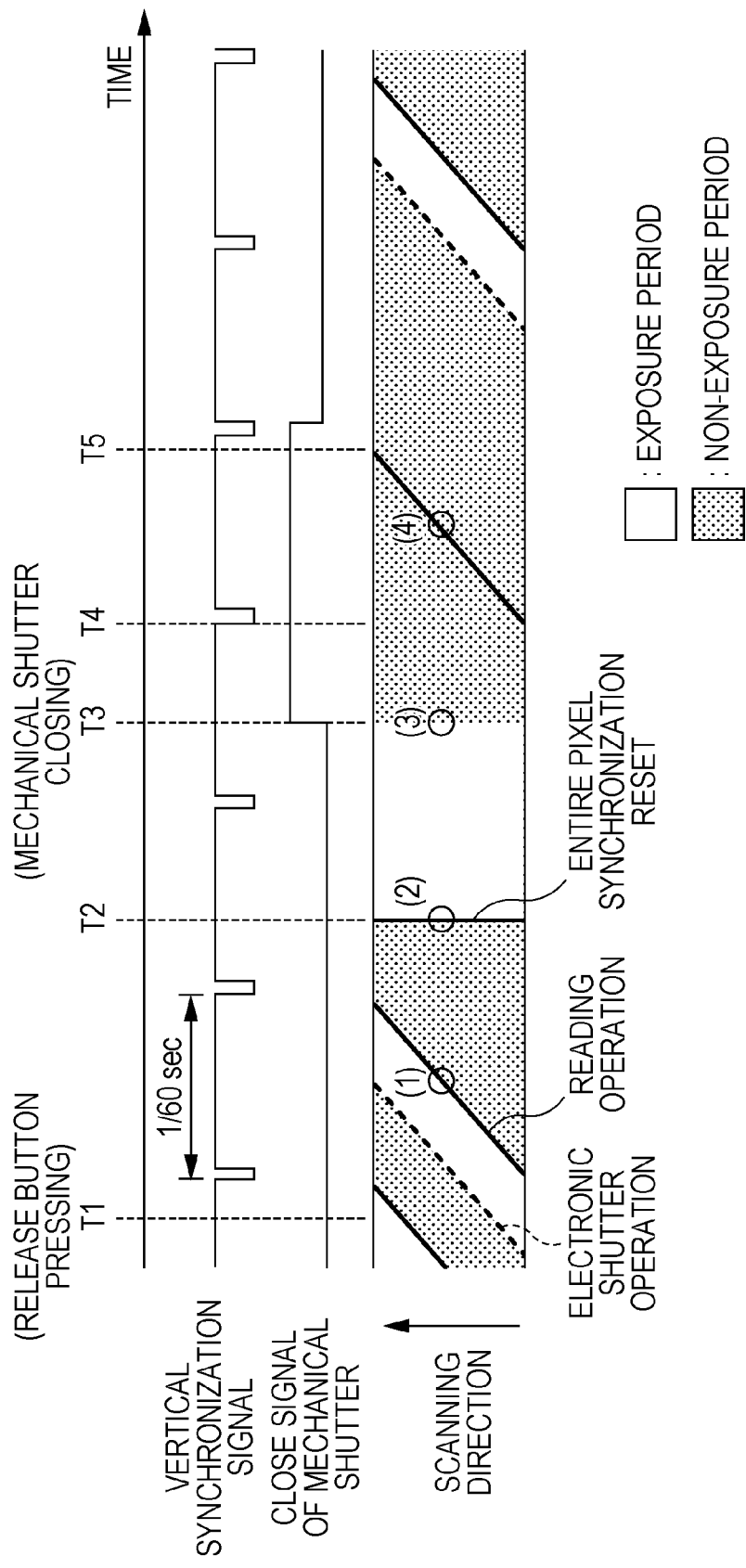
FIG. 5 is a timing chart illustrating a driving method according to a first embodiment of the invention.

FIG. 5 is a timing chart provided to illustrate the driving method according to the first embodiment of the invention. In FIG. 5, the horizontal axis indicates the time. In addition, in FIG. 5, for simplification of the drawing, the mechanical shutter is simply marked as a mecha shutter.

Normally, the mechanical shutter 513 of the image capturing apparatus is opened. Meanwhile, the CMOS image sensor 10 is operated in a monitoring mode in which the electronic shutter operation and the reading operation are scanned for every pixel row. In the operations, the exposure periods for respective rows are deviated from each other, but a moving image is captured. The operation for each row in the monitoring mode is set to an operation 1.

When the release button of the mechanical shutter 513 is pressed down (timing T1), the monitoring mode of the CMOS image sensor 10 is changed to the still image capturing mode. In the still image capturing mode, the pixel signals are sequentially read for every pixel row at the next vertical (V) synchronization signal timing, and the electronic shutter scanning operation is not performed until the next vertical synchronization signal timing.

Then, after the next vertical synchronization signal timing, all the pixel rows are simultaneously reset at a predetermined timing in accordance with the exposure period (timing T2). Due to the reset operation, the exposure period starts. The operation at this time is set to an operation 2. In all the pixel rows, when the reset pulse ϕRST is set to be active (High), the selection power source SELVdd is set to the Vdd level of High, and the transmission pulse ϕTRF is set to be active (High), it is possible to reset the photodiode 21 and the FD portion 25.

Subsequently, at the exposure period end timing, when the close signal of the mechanical shutter 513 is set to be active (High), the mechanical shutter 513 is closed (timing T3). Accordingly, it is possible to completely shield light incident to the CMOS image sensor 10. The operation at this time is set to an operation 3.

Meanwhile, in the CMOS image sensor 10, the reset pulse ϕRST for the all pixel row is set to be inactive (Low), and the selection power source SELVdd is set to the Low level in synchronization with the close operation of the mechanical shutter 513.

At the next vertical synchronization signal timing, the signal reading operation of the pixel 20 is sequentially performed for every pixel row (timings T4 and T5). The operation at this time for each row is set to an operation 4. In addition, when the signal reading operation of all the pixel rows ends, and the close signal of the mechanical shutter 513 is set to be inactive (Low), the mechanical shutter 513 is opened, and the CMOS image sensor 10 returns to the monitoring mode.

Here, the operations 1 to 4 of the CMOS image sensor 10 will be described in detail. These operations are performed by the driving operation of the vertical driving unit 13 under the control of the system control unit 17 shown in FIG. 1. In addition, the operations 1 and 4 are basically the same.

Operations 1 and 4

Figure 6A:
FIGS. 6A and 6B are timing charts illustrating operations 1 and 4 of the driving method according to the first embodiment.
Figure 6B:
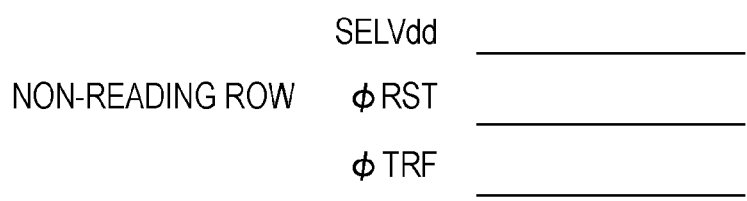

First, the operations 1 and 4 will be described with reference to the timing chart shown in FIGS. 6A and 6B. In the timing chart shown in FIGS. 6A and 6B, FIG. 6A shows the reading row, and FIG. 6B shows the non-reading row.

When the reset pulse ϕRST is set to be active and the reset transistor 23 becomes an ON state in the state where the selection power source SELVdd is set to a High level (Vdd level), the FD portion 25 is reset to the High level through the reset transistor 23. In addition, a signal corresponding to the potential of the FD portion 25 of the pixel is output as a reset level to the vertical signal line 122 through the amplifier transistor 24.

Subsequently, when the transmission pulse ϕTRF is set to be active, and the transmission transistor 22 becomes an ON state, photoelectrons are transmitted from the photodiode 21 to the FD portion 25 through the transmission transistor 22. In addition, a signal corresponding to the potential of the FD portion 25 at this time is output as a signal level to the vertical signal line 122 through the amplifier transistor 24.

In the column process unit 14 connected to the terminal of the vertical signal line 122, it is possible to obtain an accurate signal by obtaining a difference between the reset level and the signal level sequentially output from the pixel 20 through the vertical signal line 122. Here, the accurate signal indicates an original signal in which original pixel fixed pattern noise such as reset noise or a difference in threshold value of the amplifier transistor 24 is removed.

After the reset level and the signal level are read, the selection power source SELVdd is set to the Low level (for example, 0.8 V). Then, when the reset pulse ϕRST is set to be active, and the reset transistor 23 becomes an ON state, the potential of the FD portion 25 is returned to the Low level, so that the pixel is in a non-selection state.

The non-reading rows are not operated since all the reset pulse ϕRST and the transmission pulse ϕTRF are inactive during the periods of the operations 1 and 4. When the reading rows are scanned for every pixel row, a moving image is output in the operation 1, and a still image is output in the operation 4.

Operation 2

Next, the operation 2 will be described with reference to the timing chart shown in FIGS. 7A and 7B. In the timing chart shown in FIGS. 7A and 7B, FIG. 7A shows the embodiment, and FIG. 7B shows the related art.

Figure 7A:
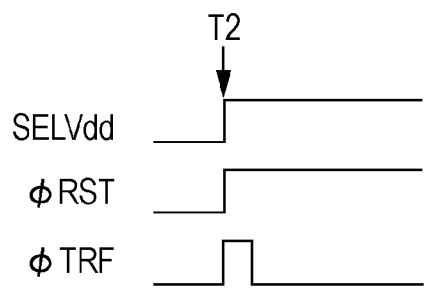
FIGS. 7A and 7B are timing charts illustrating an operation 2 of the driving method according to the first embodiment.
Figure 7B:
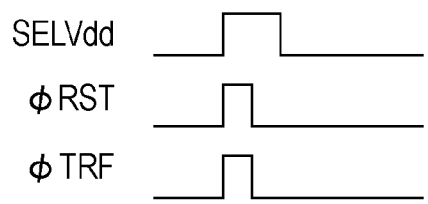

As shown in FIG. 7A, at the timing T2, the selection power source SELVdd of all the pixel rows is set to the High level, and simultaneously all the reset pulse ϕRST and the transmission pulse ϕTRF are set to be active. Accordingly, in the pixels of all the pixel rows, the FD portion 25 is reset to the High level through the reset transistors 23, and the photodiode 21 is reset to the High level through the transmission transistor 22.

After all the pixel rows are simultaneously reset, in the case of this embodiment, the selection power source SELVdd is maintained at the High level and the reset pulse ϕRST is maintained to be active. In addition, in the case of the related art, as shown in FIG. 7B, the reset pulse ϕRST and the transmission pulse φTRF are simultaneously set to be inactive, and the selection power source SELVdd is returned to the Low level.

Operation 3

Finally, the operation 3 will be described with reference to the timing chart shown in FIGS. 8A and 8B. In the FIGS. 8A and 8B, FIG. 8A shows the embodiment, and FIG. 8B shows the related art.

Figure 8A:
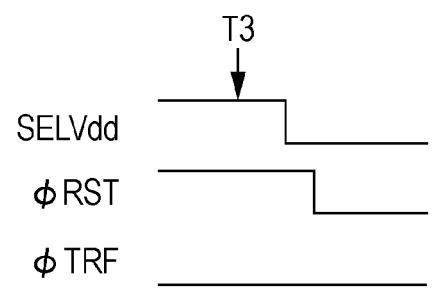
FIGS. 8A and 8B are timing charts illustrating an operation 3 of the driving method according to the first embodiment.

As shown in FIG. 8A, at the timing T3 at which the mechanical shutter 513 is closed, or before or after the timing T3 (desirably, after the timing t3), the selection power source SELVdd is returned to the Low level, and then the reset pulse φRST is set to be inactive. When the operation is performed after the timing T3, it is possible to reliably form the above-described overflow path during the exposure period, and thus to suppress the blooming.

Figure 8B:
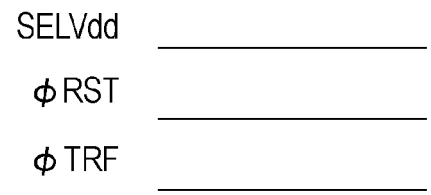

In the related art, since the selection power source SELVdd and the reset pulse φRST are returned to the Low level after simultaneously resetting all pixels in the operation 2, the selection power source SELVdd is in the Low level as shown in FIG. 8B. In addition, in this embodiment and the related art, the Low level of the selection power source SELVdd is set to a voltage value of 0.8 V at which electrons do not overflow to the photodiode 21.

As apparently shown in the above-described operations, in the CMOS image sensor 10, in the operation of the still image capturing mode, the exposure period starts by simultaneously resetting all the pixel rows, and the exposure period ends by closing the mechanical shutter 513. Likewise, since the exposure periods of the pixels of all the pixel rows are equal to each other by using the CMOS image sensor 10 together with the mechanical shutter 513, it is possible to prevent the captured image from being distorted. The same advantage is obtained in the related art.

Figure 9A:
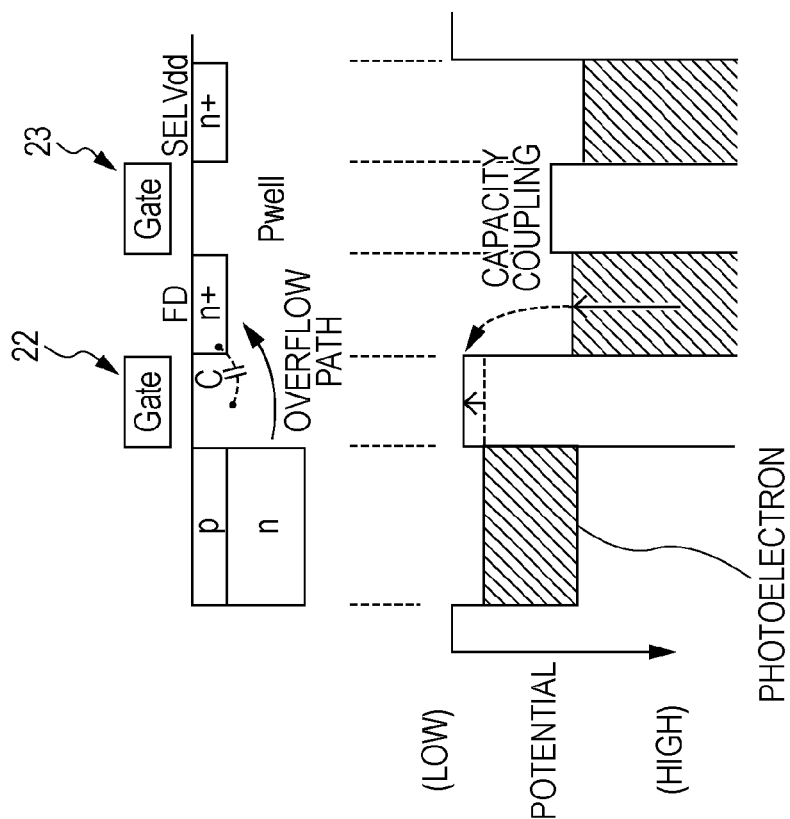
FIGS. 9A and 9B are diagrams schematically showing a part of a section of the unit pixel and a potential of the part, which are provided for the description of the first embodiment.
Figure 9B:
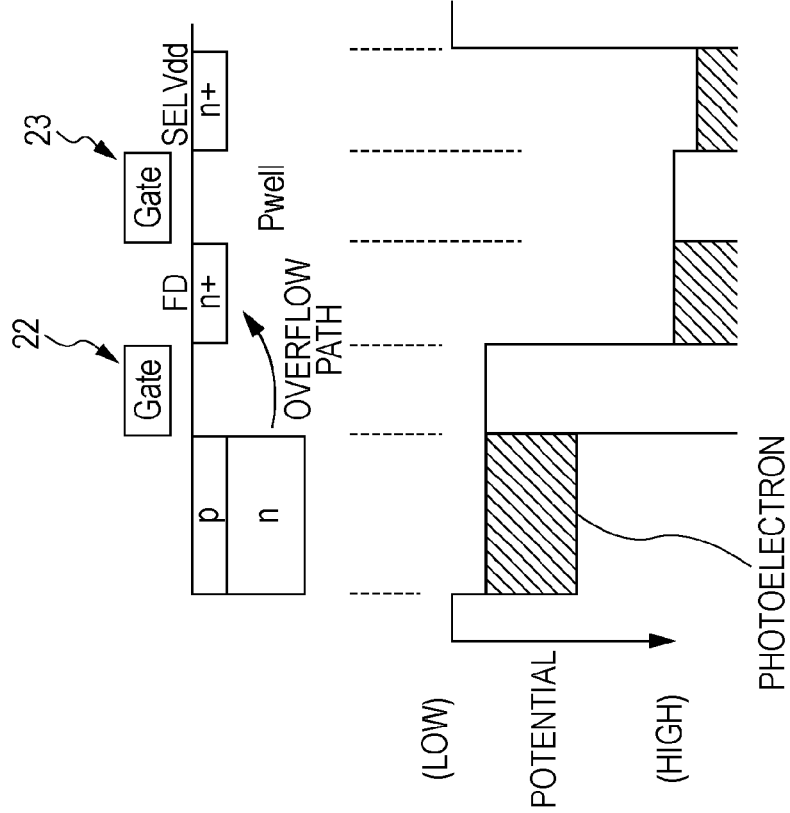

Meanwhile, the next operations are different from those of the related art. That is, during the exposure period, the selection power source SELVdd and the reset pulse φRST are set to the High level, and the potential of the outlet of the overflow path, that is, the FD portion 25 is maintained in a deep state. In addition, during a period from the exposure end to the signal reading operation, the selection power source SELVdd and the reset pulse φRST are returned to the Low level, so that the potential of the outlet (FD portion 25) of the overflow path is maintained in a shallow state. The meaning of the operations will be described with reference to FIGS. 9A and 9B.

In the still image capturing mode, since the selection power source SELVdd and the reset pulse φRST are set to the High level during the exposure period, the FD portion 25 is set to a comparatively high potential. Since the intensity of the light is large, in the pixel in which the photodiode 21 is filled with photoelectrons, the extra photoelectrons overflow from the photodiode 21 to the FD portion 25 through the above-described overflow path.

Subsequently, when the selection power source SELVdd is set to the Low level in the state where the mechanical shutter 513 is closed, the potential of the FD portion 25 is set to the Low level. That is, the potential of the FD portion 25 becomes shallow. Then, since the potential of the FD portion 25 is changed, the potential of the overflow path below the gate of the transmission transistor 22 is modulated.

In detail, the modulation is performed by parasitic capacity C interposed between the channel below the gate of the transmission transistor 22 and the diffusion layer (the diffusion layer corresponding to the drain region of the transmission region 22) of the FD portion 25. That is, due to the capacity coupling of the parasitic capacity C, the potential of the overflow path is set to a lower potential than that of the exposure period (the potential of the channel below the gate is shallow), and hence the overflow path moves in a closing direction.

Accordingly, it is possible to reduce a phenomenon such that a part of the photoelectrons collected in the photodiode 21 is discharged as a sub-threshold current through the overflow path by thermal excitation. Therefore, it is possible to suppress a phenomenon such that the number of saturated electrons decreases in a sequential order of the read pixels.

Also, it is possible to suppress the blooming by exhibiting the effect of the overflow path during the exposure period. When the mechanical shutter 513 is closed, no more light is received, and hence the overflow path is not necessary. Accordingly, when the potential is controlled in a direction in which the overflow path is closed, it is possible to suppress the number of saturated electrons from decreasing.

The characteristic point of the embodiment of the invention is that the potential of the overflow path is controlled by using the voltage of the FD portion 25. That is, during the exposure period, the FD portion 25 is set to the High level, and the overflow path below the gate of the transmission transistor 22 is made to be operative, thereby suppressing the blooming. In addition, during the period while the signals are read after closing the mechanical shutter 513, the FD portion 25 is set to the High level so as to drive the overflow path in a closing direction, and the overflow path is made to be inoperative, thereby suppressing the number of saturated electrons (a saturation charge amount) from decreasing.

According to a simulation, in the pixel currently developed by the inventors, when the voltage of the FD portion 25 is set to the High level and the Low level, the potential of the overflow path changes by about 300 mV. Meanwhile, in the driving method of the related art, a decrease in number of saturated electrons is about 300 mV of the PD potential. Accordingly, by adopting the driving method according to the embodiment of the invention, it is possible to set the decrease amount to be almost zero.

In addition, a method may be supposed which controls the potential of the overflow path by using a voltage value applied to the gate of the transmission transistor 22. However, generally, in the transmission transistor 22, the Low level of the transmission pulse φTRF applied to the gate is set to a negative voltage, and a hole is formed in a substrate surface layer portion below the gate to be in a pinning state. For this reason, even the Low level of the transmission pulse φTRF is further set to a negative voltage, the number of holes increases, but the potential of the overflow path is not changed. Accordingly, it is not possible to control the potential of the overflow path by using the potential applied to the gate of the transmission transistor 22.

4-2. Second Embodiment

The sequence of the operations of the driving method according to a second embodiment is basically the same as that of the first embodiment. Accordingly, the timing charts showing the sequence of the operations is the same as that of the first embodiment shown in FIG. 5. In addition, this embodiment is different from the first embodiment in that the detailed timings are different from those of the operations 1 to 4 in FIG. 5. Hereinafter, the different points will be described with reference to the timing chart shown in FIGS. 10A, 10B, and 10C.

Figure 10A:
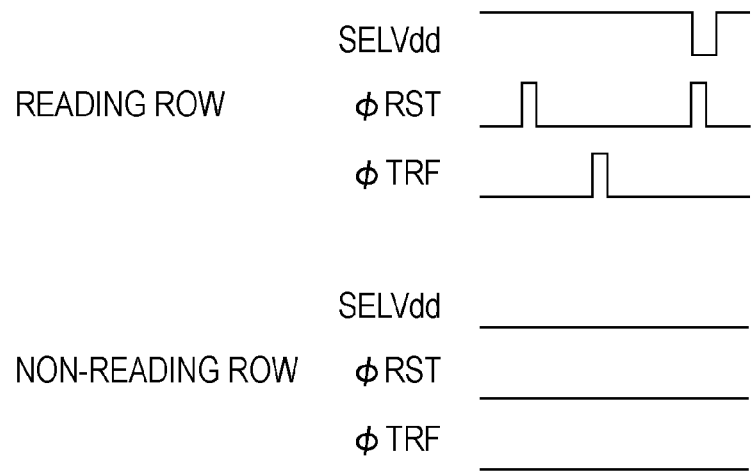
FIGS. 10A, 10B, and 10C are timing charts illustrating the operations 1 to 4 of the driving method according to a second embodiment.
Figure 10B:
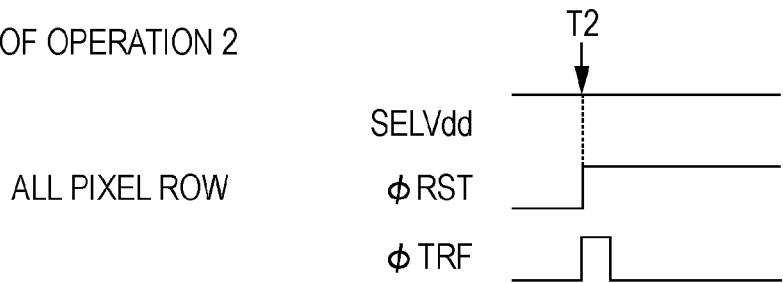
Figure 10C:
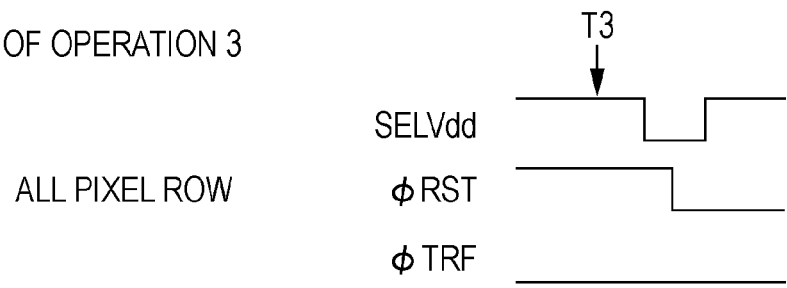

In the timing charts shown in FIGS. 10A, 10B, and 10C, FIG. 10A shows the case of the operations 1 and 4, FIG. 10B shows the case of the operation 2, and FIG. 10C shows the case of the operation 3.

Operations 1 and 4

When the reset pulse φRST is set to be active and the reset transistor 23 becomes an ON state in the state where the selection power source SELVdd is set to the High level (Vdd level), the FD portion 25 is reset to the High level through the reset transistor 23. In addition, a signal corresponding to the potential of the FD portion 25 of the pixel is output as a reset level to the vertical signal line 122 through the amplifier transistor 24.

Subsequently, when the transmission pulse φTRF is set to be active, and the transmission transistor 22 becomes an ON state, photoelectrons are transmitted from the photodiode 21 to the FD portion 25 through the transmission transistor 22. In addition, a signal corresponding to the potential of the FD portion 25 at this time is output as a signal level to the vertical signal line 122 through the amplifier transistor 24.

In the column process unit 14 connected to the terminal of the vertical signal line 122, it is possible to obtain an accurate signal by obtaining a difference between the reset level and the signal level sequentially output from the pixel 20 through the vertical signal line 122. Here, the accurate signal indicates an original signal in which original pixel fixed pattern noise such as reset noise or a difference in threshold value of the amplifier transistor 24 is removed.

After the reset level and the signal level are read, the selection power source SELVdd is set to the Low level. Then, when the reset pulse φRST is set to be active, and the reset transistor 23 becomes an ON state, the potential of the FD portion 25 is returned to the Low level, so that the pixel is in a non-selection state.

Then, the reset pulse φRST is set to be inactive, and the selection power source SELVdd is returned to the High level. Likewise, this embodiment is different from the first embodiment in that the reset pulse φRST is set to be inactive and the selection power source SELVdd is returned to the High level. When the reset transistor 23 becomes an OFF state in the state where the selection power source SELVdd is set to the Low level, even when the selection power source is returned to the High level, the FD portion 25 is maintained at the Low level.

The non-reading rows are not operated since all the reset pulse φRST and the transmission pulse φTRF are inactive during the periods of the operations 1 and 4. When the reading rows are scanned for every pixel row, a moving image is output in the operation 1, and a still image is output in the operation 4.

Operation 2

The selection power source SELVdd is maintained at the High level from the operation 1. In addition, as shown in FIG. 10B, all the reset pulse φRST and the transmission pulse φTRF are set to be active. Accordingly, in the pixels of all the pixel rows, the FD portion 25 is reset to the High level through the reset transistors 23, and the photodiode 21 is reset to the High level through the transmission transistor 22. After all the pixel rows are simultaneously reset, the selection power source SELVdd is maintained at the High level and the reset pulse φRST is maintained to be active.

Operation 3

As shown in FIG. 10C, at the timing T3 at which the mechanical shutter 513 is closed, or before or after the timing T3 (desirably, after the timing t3), the selection power source SELVdd is returned to the Low level, and then the reset pulse φRST is set to be inactive. Subsequently, the selection power source SELVdd is returned to the High level.

Likewise, this embodiment is different from the first embodiment in that the reset pulse φRST is set to be inactive and the selection power source SELVdd is returned to the High level. When the reset transistor 23 becomes an OFF state in the state where the selection power source SELVdd is set to the Low level, even when the selection power source is returned to the High level, the FD portion 25 is maintained at the Low level.

Even in the driving method according to the second embodiment, since the sequence of the operations is basically the same as that of the first embodiment, it is possible to obtain the same advantage as that of the first embodiment. That is, it is possible to suppress the blooming, and to suppress the decrease in saturation electron amount which is a problem of the mechanical shutter operation.

5. Modified Example

In addition, in the above-described embodiments, an example of a circuit configuration is described in which three transistors 22 to 24 are used as the unit pixel 20, but the invention is not limited to the configuration of the pixel including three transistors. As an example, a configuration of a pixel including four transistors may be adopted in which the selection transistor for selecting the pixel is disposed between the amplifier transistor 24 and the pixel power source Vdd or between the amplifier transistor 24 and the vertical signal line 122.

However, in the case of the configuration of the existing pixel including four transistors, the drain electrode of the reset transistor is connected to a fixed power source, and the invention may not be applied to the existing pixel configuration. Since it is possible to control the potential of the FD portion 25 by connecting the drain electrode of the reset transistor to the selection power source SELVdd, the invention may be applied.

6. Application

As an example, the above-described driving method according to the first and second embodiments may be applied to a pixel circuit adopting a plural pixel sharing structure in which a part of the constituents originally provided for each pixel is shared in plural pixels.

Plural Pixel Sharing Structure

Figure 11:
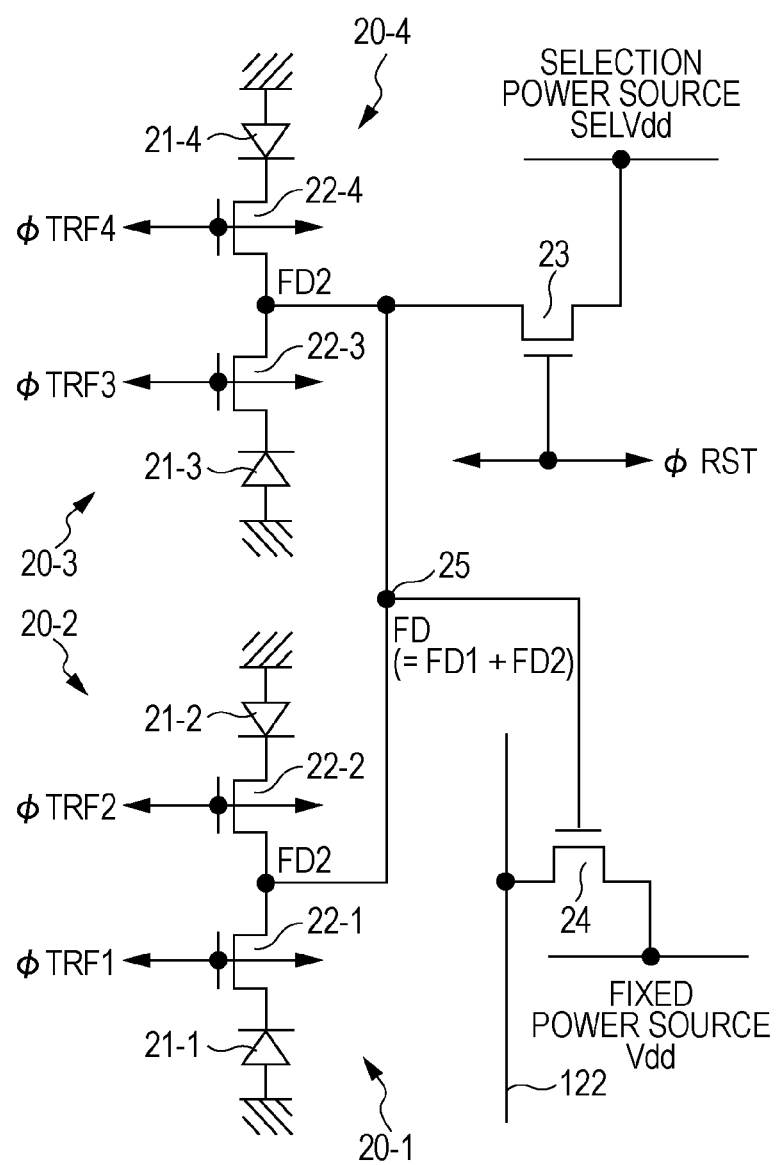
FIG. 11 is a circuit diagram showing an example of a pixel circuit according to an application of the invention adopting a plural pixel sharing structure.

FIG. 11 is a circuit diagram showing an example of a pixel circuit according to an application of the invention adopting the plural pixel sharing structure. In the drawing, the same reference numerals are given to the same constituents as those of FIG. 2.

In the pixel circuit according to the application, in the plural adjacent pixels, for example, a unit of four pixels 20-1, 20-2, 20-3, and 20-4 included in the same pixel row and adjacent to each other in the vertical direction, one FD portion 25 is commonly used (shared) in the four pixels. In the case of the sharing of the plural adjacent pixels, when the sharing is performed in the same pixel row, it is easy to control the signal reading timings of the pixels.

In the unit of four pixels 20-1, 20-2, 20-3, and 20-4, the pixels respectively include photodiodes 21-1, 21-2, 21-3, and 21-4 as photoelectric converters. In the four pixels 20-1, 20-2, 20-3, and 20-4, two of them make one pair, and the other two make one pair. In addition, the amplifier transistor 24 is provided in the pixel region of two pixels 20-1 and 20-2 of one pair, and the reset transistor 23 is provided in the pixel region of two pixels 20-3 and 20-4 of the other pair.

In the pixel circuit not adopting the plural pixel sharing structure shown in FIG. 2, each of the drain electrodes of the reset transistor 23 and the amplifier transistor 24 is connected to the selection power source SELVdd. That is, a common selection power source SELVdd is provided as the drain power sources of the reset transistor 23 and the amplifier transistor 24. On the contrary, in the pixel circuit according to the application, different power sources are provided as the drain power sources of the reset transistor 23 and the amplifier transistor 24.

As the different power sources, the fixed power source Vdd having a fixed power source voltage (voltage level) and the selection power source SELVdd having a changeable selection power source are provided. The selection power source SELVdd is capable of selecting a first voltage level of about 0.8 V or a second voltage level Vdd almost equal to the voltage level Vdd of the fixed power source Vdd, and selects a pixel when the first voltage level is changed to the second voltage level Vdd.

In addition, the drain electrode of the reset transistor 23 is connected to the selection power source SELVdd, and the drain electrode of the amplifier transistor 24 is connected to the fixed power source Vdd. The source electrode of the reset transistor 23 is connected to the FD portion 25 shared in the four pixels 20-1, 20-2, 20-3, and 20-4 in the vertical direction. The reset pulse φRST is selectively applied to the gate electrode of the reset transistor 23. The gate electrode of the amplifier transistor 24 is connected to the FD portion 25, and the source electrode thereof is connected to the vertical signal line 122.

Circuit Operation of Pixel Circuit According to the Application

Figure 12:
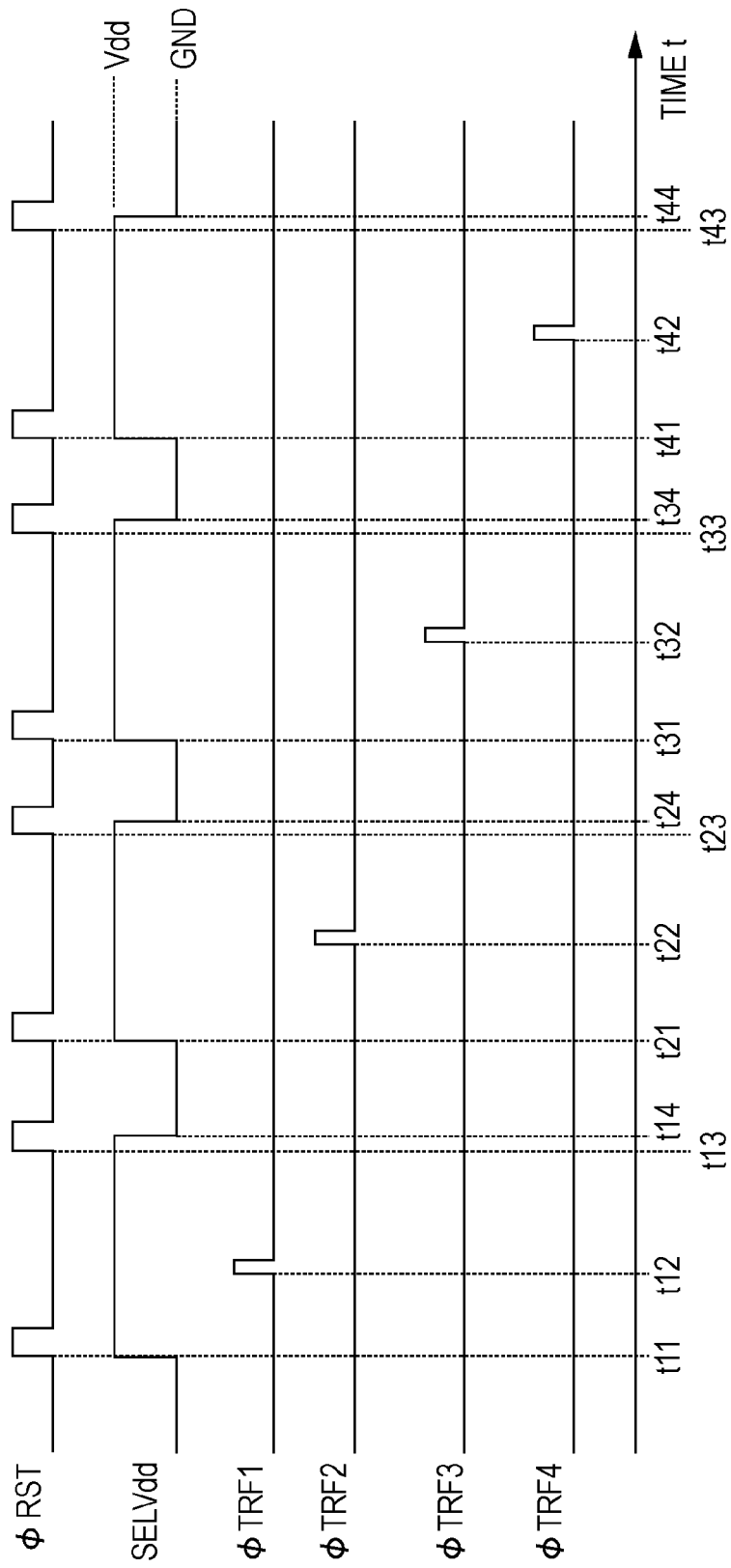
FIG. 12 is a timing chart illustrating a circuit operation of a pixel circuit according to the application of the invention.

Next, a circuit operation of the pixel circuit according to the application will be described with reference to the timing chart in FIG. 12.

When the selection power source SELVdd changes from the first voltage level (for example, 0.8 V) to the second voltage level Vdd at the timing t11, the pixels of the first to fourth rows are selected. At the same time, the reset pulse φRST is changed to an active state (in the embodiments, "H" level), so that the reset transistor 23 shared in the four pixels (of the first to fourth rows) becomes an ON state. Accordingly, the charges of the FD portion 25 shared in the four pixels is discharged to the selection power source SELVdd through the reset transistor 23. As a result, the potential of the FD portion 25 is reset to the second voltage level Vdd of the selection power source SELVdd. In addition, the potential of the FD portion 25 at this time is output as a reset level of the pixel 20-1 of the first row to the vertical signal line 122 through the amplifier transistor 24.

Subsequently, the reset pulse φRST is changed to an inactive state (in the embodiments, "L" level), and the transmission pulse φTRF1 of the first row is changed to an active state (in the embodiments, "H" level) at the timing t12, so that the transistor 22-1 of the pixel 20-1 becomes an ON state. Accordingly, signal charges (photoelectrons) obtained by the photoelectric conversion of the photodiode 21-1 are transmitted to the FD portion 25 through the transmission transistor 22-1. At this time, the potential of the FD portion 25 is a potential corresponding to the amount of the signal charge transmitted from the photodiode 21-1. In addition, the potential of the FD portion 25 is output as a signal level of the pixel 20-1 of the first row to the vertical single line 122 through the amplifier transistor 24.

Subsequently, the reset pulse φRST is changed to an active state at the timing t13, and the selection power source SELVdd changes from the second voltage level Vdd to the first voltage level of 0.8 V at the timing t14, so that the pixels of the first to fourth rows become a non-selection state.

Subsequently, the selection power source SELVdd changes from the first voltage level of 0.8 V to the second voltage level Vdd at the timing t21, so that the pixels of the first to fourth rows become a selection state again. At the same time, the reset pulse φRST is changed to an active state, so that the reset transistor 23 shared in the four pixels becomes an ON state. Accordingly, the charges of the FD portion 25 shared in the four pixels is reset to the second voltage level Vdd of the selection power source SELVdd. In addition, the potential of the FD portion 25 at this time is output as a reset level of the pixel 20-2 of the second row to the vertical signal line 122 through the amplifier transistor 24.

Subsequently, the reset pulse φRST is changed to an inactive state, and the transmission pulse φTRF2 of the second row is changed to an active state at the timing t22, so that the transistor 22-2 of the pixel 20-2 becomes an ON state. Accordingly, signal charges obtained by the photoelectric conversion of the photodiode 21-2 are transmitted to the FD portion 25 through the transmission transistor 22-2. In addition, the potential of the FD portion 25 at this time is output as a signal level of the pixel 20-2 of the second row to the vertical single line 122 through the amplifier transistor 24.

Subsequently, the reset pulse φRST is changed to an active state at the timing t23, and the selection power source SELVdd changes from the second voltage level Vdd to the first voltage level of 0.8 V at the timing t24, so that the pixels of the first to fourth rows become a non-selection state.

Subsequently, the selection power source SELVdd changes from the first voltage level of 0.8 V to the second voltage level Vdd at the timing t31, so that the pixels of the first to fourth rows become a selection state again. At the same time, the reset pulse φRST is changed to an active state, so that the reset transistor 23 shared in the four pixels becomes an ON state. Accordingly, the charges of the FD portion 25 shared in the four pixels is reset to the second voltage level Vdd of the selection power source SELVdd. In addition, the potential of the FD portion 25 at this time is output as a reset level of the pixel 20-3 of the third row to the vertical signal line 122 through the amplifier transistor 24.

Subsequently, the reset pulse φRST is changed to an inactive state, and the transmission pulse φTRF3 of the third row is changed to an active state at the timing t32, so that the transistor 22-3 of the pixel 20-3 becomes an ON state. Accordingly, signal charges obtained by the photoelectric conversion of the photodiode 21-3 are transmitted to the FD portion 25 through the transmission transistor 22-3. In addition, the potential of the FD portion 25 at this time is output as a signal level of the pixel 20-3 of the third row to the vertical single line 122 through the amplifier transistor 24.

Subsequently, the reset pulse φRST is changed to an active state at the timing t33, and the selection power source SELVdd changes from the second voltage level Vdd to the first voltage level of 0.8 V at the timing t34, so that the pixels of the first to fourth rows become a non-selection state.

Subsequently, the selection power source SELVdd changes from the first voltage level of 0.8 V to the second voltage level Vdd at the timing t41, so that the pixels of the first to fourth rows become a selection state again. At the same time, the reset pulse φRST is changed to an active state, so that the reset transistor 23 shared in the four pixels becomes an ON state. Accordingly, the charges of the FD portion 25 shared in the four pixels is reset to the second voltage level Vdd of the selection power source SELVdd. In addition, the potential of the FD portion 25 at this time is output as a reset level of the pixel 20-4 of the third row to the vertical signal line 122 through the amplifier transistor 24.

Subsequently, the reset pulse φRST is changed to an inactive state, and the transmission pulse φTRF4 of the fourth row is changed to an active state at the timing t42, so that the transistor 22-4 of the pixel 20-4 becomes an ON state. Accordingly, signal charges obtained by the photoelectric conversion of the photodiode 21-4 are transmitted to the FD portion 25 through the transmission transistor 22-4. In addition, the potential of the FD portion 25 at this time is output as a signal level of the pixel 20-4 of the fourth row to the vertical single line 122 through the amplifier transistor 24.

Subsequently, the reset pulse φRST is changed to an active state at the timing t43, and the selection power source SELVdd changes from the second voltage level Vdd to the first voltage level of 0.8 V at the timing t44, so that the pixels of the first to fourth rows become a non-selection state. Subsequently, a series of the above-described circuit operations are performed in all the pixel rows by the unit of four rows.

Even in the pixel circuit adopting the above-described plural pixel sharing structure, the drain electrode of the reset transistor 23 is connected to the selection power source SELVdd, and the potential of the FD portion 25 is controlled by changing the power source potential of the selection power source SELVdd. Accordingly, when the driving methods according to the first and second embodiments are applied to the pixel circuit adopting the plural pixel sharing structure, it is possible to suppress the blooming and the decrease in saturation electron amount which is a problem of the mechanical shutter operation.

The present application contains subject matter related to that disclosed in Japanese Priority Patent Application JP 2009-016265 filed in the Japan Patent Office on Jan. 28, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image capturing device comprising:
a pixel array unit including plural pixels each converting light selectively incident through a mechanical shutter into charges to be stored in a storage portion and having an overflow path through which charges exceeding a saturation charge amount are discharged; and
a driving unit that generates a reset signal via a reset signal line, a transfer signal via a transfer signal line and a selectable power signal via a power select line, the selectable power signal having selectable power potentials, the driving unit configured to (a) start an exposure by simultaneously resetting all pixels of the pixel array unit with each of the selectable power signal and the reset signal set to a relatively high level, (b) maintain the overflow path for each pixel in an opened state during the exposure period until after closure of the mechanical shutter, and (c) after closure of the mechanical shutter, drive the overflow path in a closing direction during a period while signals are read from the pixels by first setting the selectable power signal to a relatively low level and thereafter setting the reset signal to a relatively low level,
wherein,
each pixel includes a rest transistor that affects the potential of an outlet of the overflow path, the transistor coupled between the outlet and the power select line, the transistor having a gate to which the reset signal line is connected and driven by the driving unit to hold the outlet in the deep state beginning with the resetting of all pixels in the array to after ending of the exposure period, the driving unit maintaining a potential of an outlet of the overflow path for each pixel in a deep state during the exposure period and until after closure of the mechanical shutter and maintaining the potential of the outlet of the overflow path in a shallow state during the period while the signals are read from the pixels after ending the exposure by closing the mechanical shutter.

2. The solid-state image capturing device according to claim 1, comprising a field effect transistor, wherein:
the storage portion is an inlet of the overflow path and a diffusion layer is the outlet of the overflow path, and
a source of the field effect transistor is connected to the storage portion and a drain of the field effect transistor is connected to the diffusion layer.

3. The solid-state image capturing device according to claim 2, wherein the field effect transistor is a transmission transistor transmitting the charges stored in the storage portion to the diffusion layer.

4. The solid-state image capturing device according to claim 3, wherein when the power potential applied to the diffusion layer via the reset transistor is changed, capacitance coupling is caused by parasitic capacitance interposed between the diffusion layer and a channel below a gate of the transmission transistor, and the potential of the channel becomes shallow due to the capacitance coupling, so that the overflow path moves in the closing direction.

5. A method of driving a solid-state image capturing device including a pixel array unit including plural pixels each converting light selectively incident through a mechanical shutter into charges to be stored in a storage portion and having an overflow path through which charges exceeding a saturation charge amount are discharged, the method comprising the steps of:
starting an exposure by simultaneously resetting all pixels of the pixel array unit by applying a relatively high potential to an outlet of the overflow paths;
maintaining the overflow path in an opened state during the exposure period;
maintaining a potential of the outlet of the overflow path in a deep state during the exposure period and until after closure of the mechanical shutter by applying the relatively high potential thereto;
driving the overflow path in a closing direction during a period while signals are read from the pixels after ending the exposure by closing the mechanical shutter by first applying a relatively low potential to the outlet and thereafter removing the application potentials to the outlet; and
maintaining the potential of the outlet of the overflow path in a shallow state during the period while the signals are read from the pixels after ending the exposure by closing the mechanical shutter.

6. An image capturing apparatus comprising:
a mechanical shutter selectively receiving incident light; and
a solid-state image capturing device including a pixel array unit including plural pixels each converting light selectively incident through a mechanical shutter into charges to be stored in a storage portion and having an overflow path through which charges exceeding a saturation charge amount are discharged,
wherein
the solid-state image capturing device starts an exposure by simultaneously resetting all pixels of the pixel array unit while applying a relatively high potential to the overflow path outlet, maintains the overflow path in an opened state during the exposure period by continuing to apply the relatively high potential to the overflow path outlet, and drives the overflow path in a closing direction during a period while signals are read from the pixels after ending the exposure by closing the mechanical shutter by first applying a relatively low potential to the overflow path outlet and thereafter removing the application of any potential to the overflow path outlet, the driving unit maintains a potential of an outlet of the overflow path for each pixel in a deep state during the exposure period and until after closure of the mechanical shutter by applying the relatively high potential thereto, and maintains the potential of the outlet of the overflow path in a shallow state during the period while the signals are read from the pixels after ending the exposure by closing the mechanical shutter.

7. A method of driving an image capturing apparatus including a mechanical shutter selectively receiving incident light, and a solid-state image capturing device including a pixel array unit including plural pixels each converting light selectively incident through a mechanical shutter into charges to be stored in a storage portion and having an overflow path through which charges exceeding a saturation charge amount are discharged, the method comprising, for each pixel, the steps of:

starting an exposure by simultaneously resetting all pixels of the pixel array unit by applying a relatively high potential to an outlet of the overflow path;

maintaining the overflow path in an opened state during the exposure period;

maintaining a potential of the outlet of the overflow path in a deep state during the exposure period and until after closure of the mechanical shutter by applying the relatively high potential thereto;

driving the overflow path in a closing direction during a period while signals are read from the pixels after ending the exposure by closing the mechanical shutter by first applying a relatively low potential to the outlet and thereafter removing the application of any potential to the overflow path; and maintaining the potential of the outlet of the overflow path in a shallow state during the period while the signals are read from the pixels after ending the exposure by closing the mechanical shutter.

8. A solid-state imaging device comprising:

a pixel array unit including plural pixels each converting light selectively incident through a mechanical shutter into charges to be stored in a storage portion and having an overflow path through which charges exceeding a saturation charge amount are discharged each overflow path having an overflow path outlet; and a driving unit that starts an exposure by simultaneously resetting all pixels of the pixel array unit while applying a relatively high potential to the overflow path outlets, and for each pixel, (a) maintains the overflow path in an opened state during the exposure period by continuing to apply the relatively high potential to the overflow path outlet, and (b) drives the overflow path in a closing direction during a period while signals are read from the pixels after ending the exposure by closing the mechanical shutter by first applying a relatively low potential to the overflow path outlet and thereafter removing the application of any potential to the overflow path outlet, wherein, the driving unit maintains a potential of an outlet of the overflow path for each pixel in a deep state during the exposure period and until after closure of the mechanical shutter by applying the relatively high potential thereto, and maintains the potential of the outlet of the overflow path in a shallow state during the period while the signals are read from the pixels after ending the exposure by closing the mechanical shutter.

* * * * *